United States Patent [19]

Mizuno et al.

[11] Patent Number: 5,766,363
[45] Date of Patent: Jun. 16, 1998

[54] HEATER FOR CVD APPARATUS

[75] Inventors: Shigeru Mizuno, Kawasaki; Kazuhito Watanabe, Sagamihara; Takanori Yoshimura, Hino; Nobuyuki Takahashi, Mitaka, all of Japan

[73] Assignee: Anelva Corporation, Tokyo, Japan

[21] Appl. No.: 634,873

[22] Filed: Apr. 19, 1996

[30] Foreign Application Priority Data

Apr. 28, 1995 [JP] Japan .................. 7-129207

[51] Int. Cl.⁶ .................. C23C 16/00
[52] U.S. Cl. .................. 118/725; 118/728
[58] Field of Search .................. 118/725, 728

[56] References Cited

U.S. PATENT DOCUMENTS

| | | | |
|---|---|---|---|
| 4,854,263 | 8/1989 | Chang | 118/715 |
| 5,094,885 | 3/1992 | Selbrede | 427/248.1 |
| 5,294,778 | 3/1994 | Carman | 219/385 |
| 5,343,022 | 8/1994 | Gilbert | 219/552 |
| 5,344,492 | 9/1994 | Sato | 118/725 |
| 5,445,677 | 8/1995 | Kawata | 118/724 |
| 5,462,603 | 10/1995 | Murakami | 118/719 |
| 5,476,548 | 12/1995 | Lei | 118/728 |

FOREIGN PATENT DOCUMENTS 05-223342  8/1993  Japan .

OTHER PUBLICATIONS

Shin–Etsu Chemical Co., Ltd., "PBN/PG Ceramic Heaters"

*Primary Examiner*—R. Bruce Breneman
*Assistant Examiner*—Jeffrie R. Lund
*Attorney, Agent, or Firm*—Oliff & Berridge, PLC

[57] ABSTRACT

A heater is used in a CVD apparatus. In the CVD apparatus, reactive gas is supplied through a reactive gas supply plate to a substrate on a substrate holder to deposit a film on the substrate, and a purge gas supply passage is formed by placing a shield mechanism around the substrate holder, the shield mechanism including a ring plate disposed close to the outer periphery of the substrate. During film deposition, purge gas supplied through the purge gas supply passage is blown off from a clearance between the substrate and the ring plate, thereby preventing a film from being deposited on the rear surface of the substrate or the like. A heating element is arranged in a space in the purge gas supply passage close to but not contacting the substrate holder. The heating element is preferably a ceramic heater.

9 Claims, 4 Drawing Sheets

HEATER FOR CVD APPARATUS

BACKGROUND OF THE INVENTION

1. Field of the Invention

The present invention relates to a heater for CVD apparatus, and, more particularly, to a heater suitable for a CVD apparatus which deposits a thin film by utilizing chemical vapor deposition based on chemical reaction in a semiconductor device manufacturing process.

2. Description of the Related Art

In recent manufacturing of semiconductor devices, electronic circuit elements incorporated in the devices are more and more integrated and miniaturized. Miniaturization of the elements in the manufacturing process requires new techniques. For example, techniques for sufficiently filling fine holes with films, reducing the steps caused on the elements, reducing heat generation due to high current density, or prevention of breaking of wires by electromigration are required. As one of the manufacturing processes meeting such technical requirements, in place of the sputtering process depositing an aluminum film, a thermal CVD (chemical vapor deposition) process attracts attention, which uses $WF_6$ (tungsten hexafluoride) gas and $H_2$ gas to deposit a blanket tungsten film (hereinafter referred as a "B-W film"). When such a B-W film is used, sufficient step coverage characteristics can be attained even for a hole with a diameter of 0.5 μm or less and an aspect ratio of 2 or more. Thus, the thermal CVD process satisfies the above requirements such as for flattening of elements, and prevention of breaking of wires by electromigration.

A conventional example of a CVD apparatus for depositing the B-W film is described with reference to FIG. 6. In the CVD apparatus, a reactive gas supply plate 12 is provided in the upper region of a reactor 11, and a substrate holder 13 is provided in the lower region thereof. A substrate 14 is placed on the top surface of the substrate holder 13. The plane shape of a substrate holder 13 is circular. In the figure, the illustration of a support mechanism for the substrate holder 13 is omitted. In addition, a quartz window 15 is provided in the lower wall of the reactor 11.

Formed in the bottom surface of the reactive gas supply plate 12 are a plurality of gas outlets 12a through which the reactive gas supplied through a gas supply pipe 16 is blown off and introduced into the reactor 11. The bottom surface of the reactive gas supply plate 12 faces the substrate 14 placed on the substrate holder 13. The reactive gas supplied through the reactive gas supply plate 12 deposits a desired thin film on the surface of the substrate 14. Unreacted gas and by-product gas generated in the reactor 11 are evacuated through an evacuation section 17.

A ring plate 18 is disposed around the top surface of the substrate holder 13. The ring plate 18 is supported and can be vertically moved by a plurality of up and down movable shafts 19. The ring plate 18 is arranged near the outer periphery of the substrate 14 placed on the substrate holder 13. The inner periphery of the ring plate 18 overlaps the outer periphery of the substrate 14. A tubular shield member 20 is disposed outside the ring plate 18. A seal ring 21 is provided on the upper rim of the shield member 20. When the ring plate 18 is moved to its lowest position, the ring plate 18 contacts the seal ring 21 on the shield member 20 with the bottom surface of its outer periphery. At this lowest position, the lower wall of the reactor 11, the shield member 20, the ring plate 18, and the substrate holder 13 form a passage through which the purge gas introduced from a purge gas introduction section 26 flows. The purge gas introduced in the reactor 11 is blown off from a clearance 22 formed between the ring plate 18 and the substrate 14. This arrangement as to the purge gas prevents the reactive gas supplied through the reactive gas supply plate 12 from entering into the clearance 22 and from depositing films on the rear surface of the substrate 14, around the substrate holder 13, or on the quartz window 15.

The ring plate 18 is designed to be vertically movable so that the ring plate 18 covers the outer periphery of the substrate 14 slightly from above to form a desired clearance 22 between it and the substrate 14, and to attain a desired purge gas blow-off rate in the clearance 22 between the substrate 14 and the ring plate 18 within a range such that distribution of the deposited film on the substrate 14 is not affected.

An annular lamp support member 23 with reflectors is disposed below the quartz window 15 provided in the lower wall of the reactor 11. A plurality of heating lamps 24 are mounted on the lamp support member 23 with substantially equal spacing. Radiant heat generated from the heating lamps 24 is provided to the substrate holder 13 through the quartz window 15 to heat the substrate holder 13. The substrate 14 is heated by the heat conducted from the substrate holder 13. The temperature of the substrate holder 13 is measured by a thermocouple 25 embedded therein. Then, the measurement data is fed back to a controller, not shown, and used to control the temperature of the substrate holder 13.

With the above arrangement, the reactive gas is introduced for the substrate 14 placed on the substrate holder 13 through the reactive gas supply plate 12 to deposit a desired thin film on the substrate 14. The unreacted gas and the by-product gas generated in the reactor 11 is evacuated through the evacuation section 17. During film deposition, the purge gas is supplied through a purge gas introduction section 26, a purge gas supply passage 27, and the clearance 22 for blowing off the purge gas. The purge gas blown off through the outer periphery of the substrate 14 prevents the reactive gas from entering into the clearance 22, and also prevents a film from being deposited on the rear surface of the substrate 14, the quartz window 15 and the substrate holder 13.

In particular, the purge gas is arranged to be blown off only from the clearance 22 between the substrate 14 and the ring plate 18 so that a film is not deposited on the rear surface of the substrate.

In addition, it is necessary to provide good distribution of heat (i.e. an even temperature distribution) in the substrate holder 13 so that the thickness of film deposited on the substrate 14 is uniform. In the conventional CVD apparatus, this has been attained by specially designing the geometries of the plurality of lamps 24 and reflecting plates 23a. That is, since usually the temperature is more and more lowered toward the outer periphery of the substrate holder 13, the plurality of lamps are circularly arranged so that light from the lamps 24 is focused to the outer periphery, and the illuminating angle is restricted by the geometry of the reflecting plates 23a.

Furthermore, although not shown, there is an approach in which heating elements such as resistance wires are embedded in the substrate holder 13 as a heating mechanism for the substrate holder 13. Current is supplied through these heating elements to heat the substrate holder 13 with heat (joules) which is generated.

In depositing the B-W film by the above-mentioned conventional CVD apparatus, film deposition conditions in the initial formation core generation stage, the early stage of film deposition, are a 2–10 sccm flow rate for the reactive gas $WF_6$, a 2–10 sccm flow rate for $SiH_4$, a 100–500 sccm flow rate for the purge gas (Ar), 400°–500 °C. for the film deposition temperature, and 0.5–10 Torr for the film deposition pressure. Then, the conditions for a thick film being deposited by reduction of $H_2$ are a 50–200 sccm flow rate for the reactive gas $WF_6$, a 500–2000 sccm flow rate for $H_2$, a 300–1000 sccm flow rate for the purge gas Ar, 400°–500° C. for the film deposition temperature, and 30–70 Torr for the film deposition pressure.

A heater for the above-mentioned conventional CVD apparatus has the following problems.

The heater has been designed to concentratedly heat specific portions of the substrate holder 13. However, since the heating lamps 24 are disposed outside the reactor 11, the lamps 24 are distant from the substrate holder 13, and, since each of the lamps 24 has a certain finite size, irradiation of light from the lamp is spread to be larger than the aperture diameter of the reflecting plate 23a so that it was impossible to fully adjust the irradiation position and to finely adjust the temperature of the substrate holder 13. In addition, even if the aperture diameter of the reflecting plate 23a is made smaller, heat is accumulated within the reflecting plate, so that there arises a problem of accelerated deterioration of the lamps 24. To eliminate this problem, it is contemplated to house the lamps 24 in the reactor 11 so as to directly irradiate the substrate holder 13. However, this is impossible because the internal pressure of the reactor is reduced.

In addition, when the lamp heater is used as the heater, there is such an inconvenience that it must be periodically replaced in a relatively short period of time because the lamp has a relatively short life. The replacing operation is also not so easy because the surrounding reflecting plate and wiring are simultaneously removed as well. In a case where there are a plurality of lamps or where the lamp is displaced beneath the reactor, the operation becomes more cumbersome. This problem extends the time for lamp replacement, therefore leading to a decrease in the uptime of the entire system.

Furthermore, heating by the lamp requires the quartz window 15 in the wall of the reactor 11, an inner surface of which is easily contaminated by the reactive gas or the by-product gas residual in the reactor. Since this prevents transmission of light of the lamp to lower the heating efficiency for the substrate holder 13, the lamp must have its heating power increased, thereby further shortening the life of the lamp.

Furthermore, in a case where resistance wire heating elements are used in the substrate holder 13 as the heater, the resistance wires are relatively frequently broken, so it is necessary to periodically replace them. Since replacing the resistance wire means replacement of the substrate holder itself, there arises a problem such that the system becomes very expensive to operate.

SUMMARY OF THE INVENTION

The object of the present invention is to solve the above problems, and to provide a heater for a CVD apparatus which has good controllability over temperature distribution on a substrate holder, which can be easily replaced without decreasing the uptime of the apparatus by a lengthy replacement operation, which can provide high yield and high productivity, and which has high usability.

The present invention is directed to a heater for a CVD apparatus for attaining the above object.

A heater having the features of the present invention is applied to a CVD apparatus. In the CVD apparatus, a substrate is placed on a substrate holder in a reactor, and supplied with reactive gas through a reactive gas supply plate. A film is deposited on the substrate based on the reactive gas. In addition, disposed close to the outer periphery of the substrate is a shield mechanism including a ring plate. A purge gas supply passage is formed by providing the shield mechanism around the substrate holder. In depositing the film on the substrate, purge gas such as Ar supplied through the purge gas supply passage is blown off through a clearance between the substrate and the ring plate, and prevents a film from being deposited on the rear surface of the substrate or the like. An arrangement as a feature of the heater according to the present invention is a space formed in the purge gas supply passage which allows a heating element to be disposed close to the substrate holder in a non-contact state to the substrate holder. It is a matter of course that the heater according to the present invention may be applied to any semiconductor manufacturing device similar to the CVD apparatus.

According to the above arrangement of the present invention, the purge gas supplied through the purge gas introducing section provided in the reactor and the purge gas supply passage is blown off through the clearance between the substrate and the ring plate, thereby preventing a film from being deposited on the rear surface of the substrate. Moreover, the substrate holder can be maintained at an appropriate temperature by utilizing the space formed by the purge gas supply passage to dispose the heating element at a position close to but not contacting the substrate holder in the reactor. The heating element is preferably a flat member.

In the above arrangement, the heating element is a flat ceramic heater, the ceramic heater being fixed on at least three ceramic supports provided on the wall of the reactor. The ceramic heater is advantageous in that it is easily handled.

The ceramic heater is designed and manufactured for its shape so that it is disposed in a very narrow space in the reactor while not contacting the substrate holder. Particularly, because, when the ceramic heater generates heat, it causes warp by its heat, the ceramic heater is fixed on at least three supports formed by the same ceramic material with, for example, fixing members of the same material so that it does not contact the substrate holder and there arises no deviation of temperature distribution in the substrate holder. This suppresses warp and prevents contact of the substrate holder or the like. In addition, the mounting structure for the ceramic heater is simplified in the reactor so that the ceramic heater can be easily dismounted and replaced.

In the above arrangement, wiring terminals of the ceramic heater are preferably provided with ceramic protection covers.

In the above arrangement, a heating section of the ceramic heater (a carbon coating section formed on the surface) is divided into two regions, preferably three regions of inner, intermediate, and outer regions, which are separately controlled for temperature.

Temperature distribution in the substrate holder can be best suitably controlled depending on circumstances or conditions by independently controlling power supply to the divided, for example, three heating regions on the ceramic heater.

In the above arrangement, the wiring terminal (wire fixing screw) is made of a high refractory metal.

In the above arrangement, a reflecting plate is provided behind the rear surface of the ceramic heater for enhancing the heating efficiency.

As clearly seen from the above, according to the heater of the present invention, since the ceramic heater preferably having a predetermined mounting structure is used and disposed in the reactor, it is possible to improve controllability for temperature distribution on the substrate holder, to enhance the heating efficiency, and to easily replace the heater section. In addition, it is possible to improve the operating efficiency of the CVD apparatus, and to attain high yield and high productivity.

DESCRIPTION OF THE PREFERRED EMBODIMENTS

Now, a preferred embodiment of the present invention will be explained with reference to the attached drawings.

Figure 1:
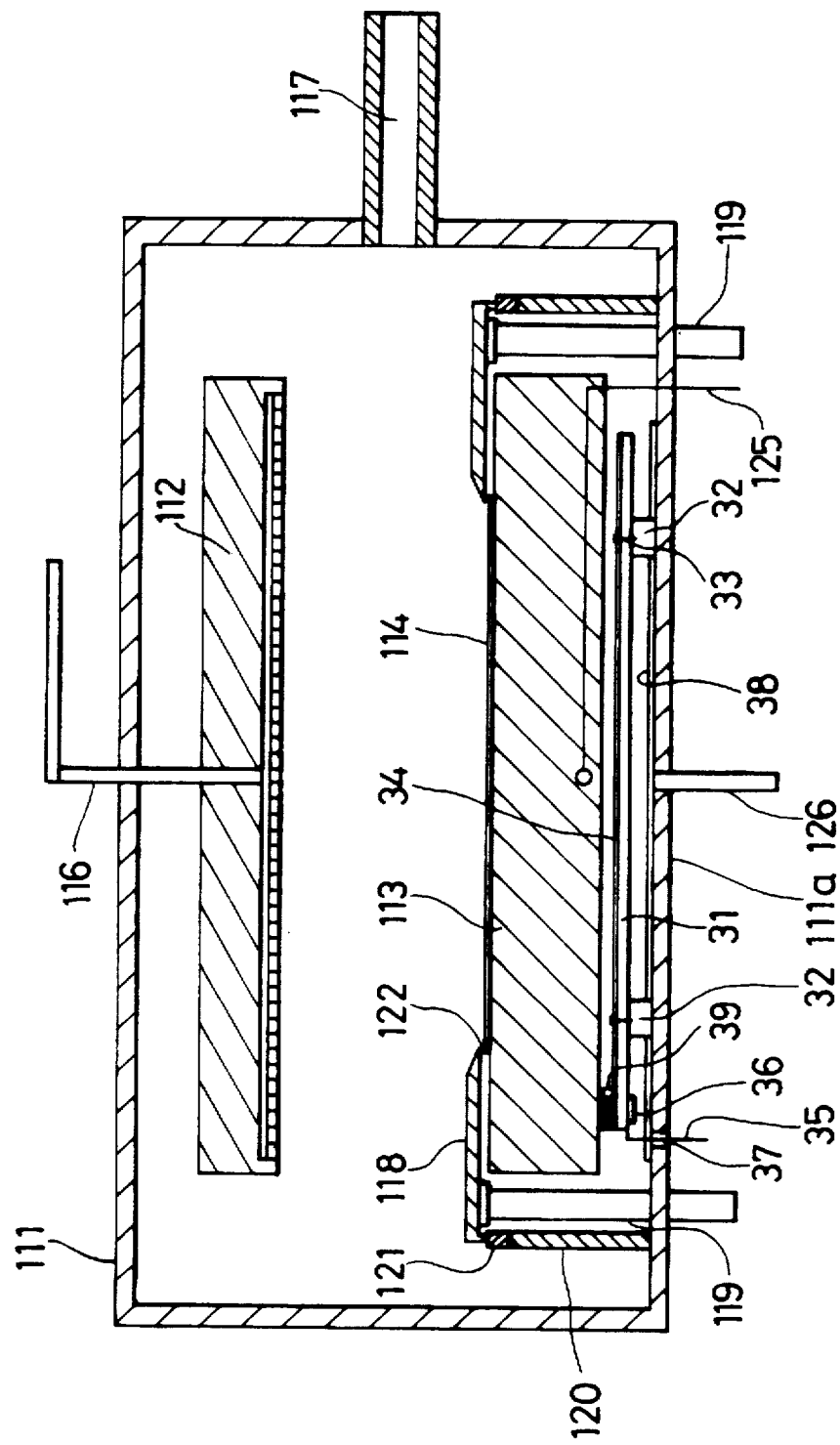
FIG. 1 is a longitudinal sectional view schematically showing a CVD apparatus with a heater according to the present invention.
Figure 6:
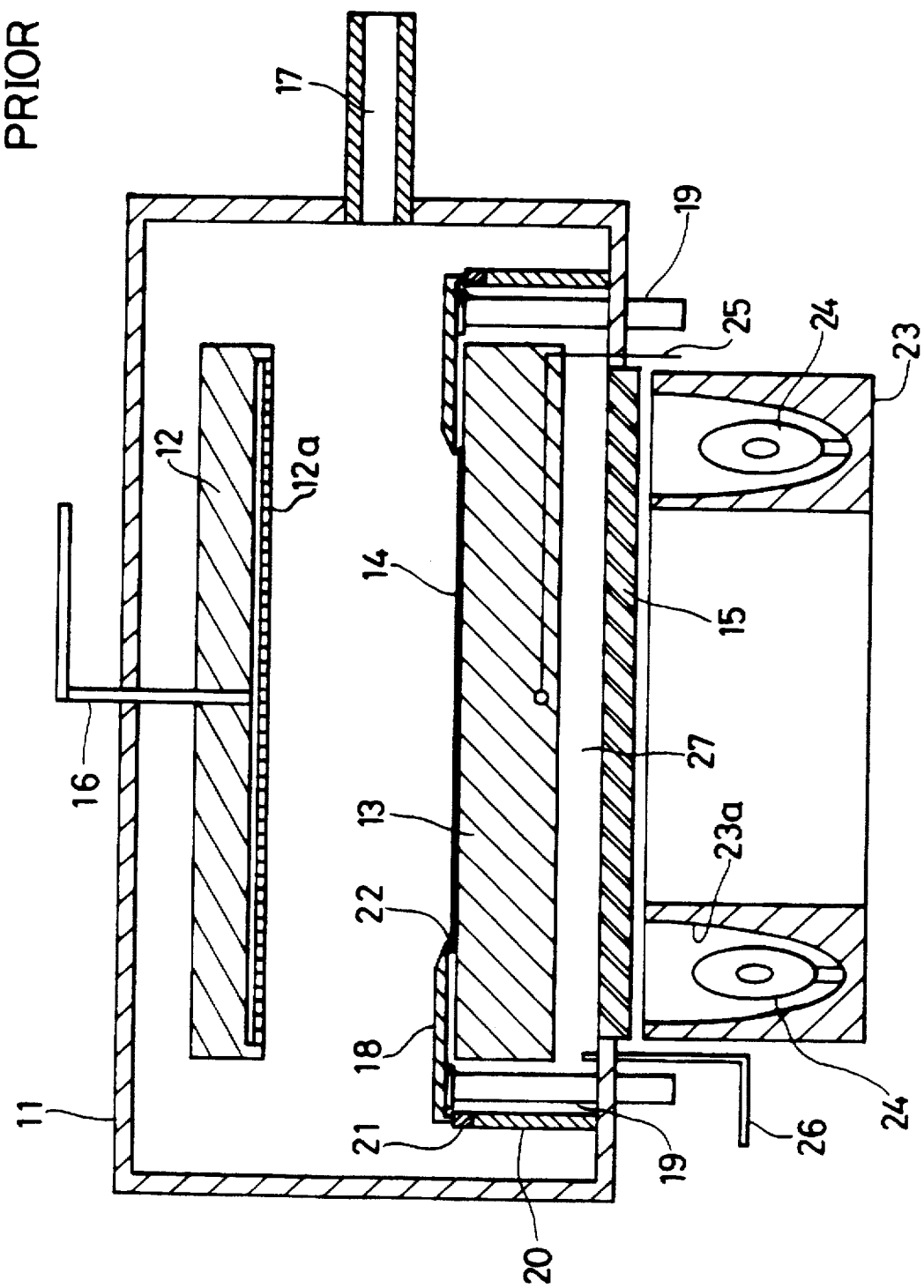
FIG. 6 is a longitudinal sectional view showing an example of a heater for a conventional CVD apparatus.

In FIG. 1, components substantially identical to those described for FIG. 6 are shown with different reference numbers. Components structurally the same as those of the conventional CVD apparatus are generally described with reference to FIG. 1. A reactive gas supply plate 112 for supplying reactive gas via gas supply pipe 116 is provided on an upper portion of the reactor 111, and a substrate holder 113 having a substantially circular surface on which a substrate 114 is placed is provided on a lower portion thereof. A desired thin film is deposited on the surface of the substrate 114 by the reactive gas supplied through the reactive gas supply plate 112. Unreacted gas and by-product gas generated in the reactor 111 are evacuated through an evacuation section 117. A ring plate 118 is placed around the upper surface of the substrate holder 113, and is supported and can be vertically moved by a plurality of up and down movable shafts 119. The ring plate 118 is disposed close to the outer periphery of the substrate 114, and the inner periphery of the ring plate 118 preferably overlaps the outer periphery of the substrate 114. A tubular shield member 120 is disposed around the ring plate 118. A seal ring (viton plate) 121 is provided on the upper edge of the shield member 120. When the ring plate 118 vertically moved by the up and down movable shafts 119 reaches its lower limit position, the bottom surface of the outer periphery of the ring plate 118 contacts the seal ring 121. At the lower limit position, a passage (purge gas supply passage) for allowing the purge gas introduced through the purge gas introduction section 126 to flow is formed by a lower wall 111a of the reactor 111, the shield member 120, the ring plate 118, and the substrate holder 113. While the ring plate 118 is at its lower limit position, the ring plate 118 is pressed against the seal ring 121, whereby the purge gas supply passage is isolated from the inner atmosphere of the reactor 111. The purge gas introduced into the reactor 111 is blown off through a clearance 122 formed between the ring plate 118 and the substrate 114. With such an arrangement, the reactive gas supplied through the reactive gas supply plate 112 is prevented from entering into the clearance 122. This prevents a film from being deposited on the rear surface of the substrate 114 or the substrate holder 113.

By vertically moving the ring plate 118, the ring plate 118 covers the outer periphery of the substrate 114 slightly from above to form a desired clearance 122 between it and the substrate 114, and to attain a desired purge gas blow-off speed in the clearance 122 between the substrate 114 and the ring plate 118 within a range such that distribution of the deposited film on the substrate 114 is not affected.

The substrate holder 113, preferably, is disposed substantially horizontally in the reactor 111 and supports the substrate 114 and provides necessary heat to the substrate 114 through conduction. The substrate holder 113 is heated by radiant heat from a ceramic heater 31 which is disposed between the substrate holder 113 and the lower wall 111a of the reactor 111, and which is preferably of a flat shape. The ceramic heater 31 is disposed in a manner that it does not contact the substrate holder 113 nor the wall of the reactor 111. The ceramic heater 31 is flat, and faces the flat bottom surface of the substrate holder 113 with its larger area so that it can uniformly provide heat. The location where the ceramic heater 31 is disposed is inside the passage through which the purge gas is supplied into the reactor 111 as described above. The ceramic heater 31 is designed to be compact so that it can be disposed within the reactor 111. In addition, since the ceramic heater 31 has a very long life, frequency of replacement can be reduced.

Figure 2:
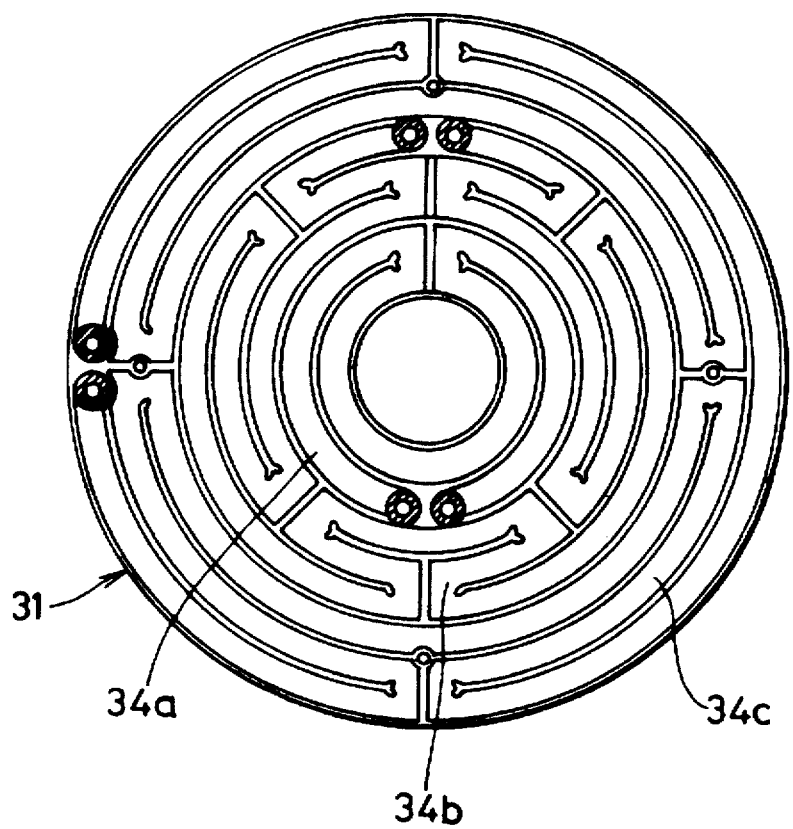
FIG. 2 is a plan view of a ceramic heater.

The ceramic heater 31 is fixed on at least three ceramic supports 32 by using screws 33, preferably, of ceramics. The ceramic heater 31 is circular in shape, and is coated with carbon coating 34 having a pattern thereon as shown in FIG. 2. Heat is generated by supplying current to the carbon coating 34 through an external power supply line 35 and a wire fixing screw 36. The power supply line 35 is wired through a seal 37. The ceramic heater 31 is preferably disposed such that its wire fixing screw 36 does not contact the substrate holder 113 or the reactor 111 when warp occurs. Since the ceramic heater 31 and the substrate holder 113 are closely disposed, very good heating efficiency can be attained. A reflecting plate 38 formed by, for example, tantalum (Ta) is arranged under the ceramic heater 31.

With the above structure for mounting the ceramic heater 31, warp can be suppressed when heat is generated. It makes the replacement operation easy when the ceramic heater 31 is removed and replaced.

The wire fixing screw 36 is formed for this embodiment by using tungsten (W). Other metal materials with high melting point and low resistance such as molybdenum (Mo) and tantalum (Ta) may be used. The wire fixing screw 36 is covered with a protection cap 39 made of, preferably, ceramics so that the wire fixing screw does not directly contacts the substrate holder 113 when the ceramic heater 31 is significantly warped under intense heat. Since the ceramic heater 31 has a possibility of contact with the substrate holder 113 when large warp occurs due to repeated heating, the ceramic heater 31 is fixed on the support 32 vertically mounted on the lower wall of the reactor to avoid the possibility as much as possible.

The carbon coating 34 on the ceramic heater 31 is radially divided, as shown in FIG. 2, into three regions, an inner region (inner heater) 34a, an intermediate region (intermediate heater) 34b and an outer region (outer heater) 34c each of which is independently controlled for power by its control system. The number of divisions of the carbon coating 34 is, preferably, two or more.

Figure 3:
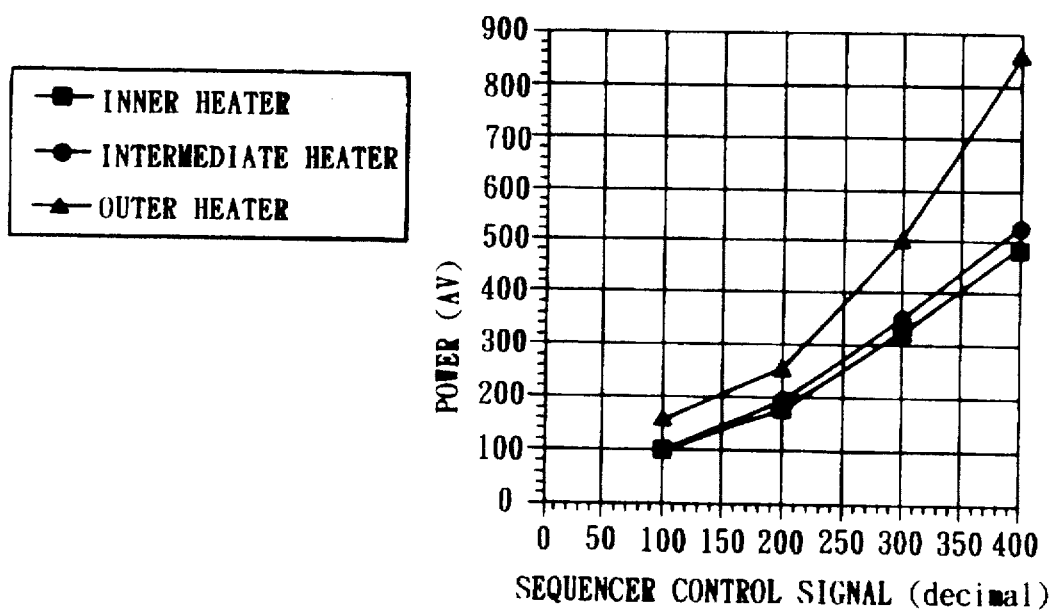
FIG. 3 is a graph showing the relationship between control signal values at various regions on the ceramic heater of this embodiment and power.
Figure 4:
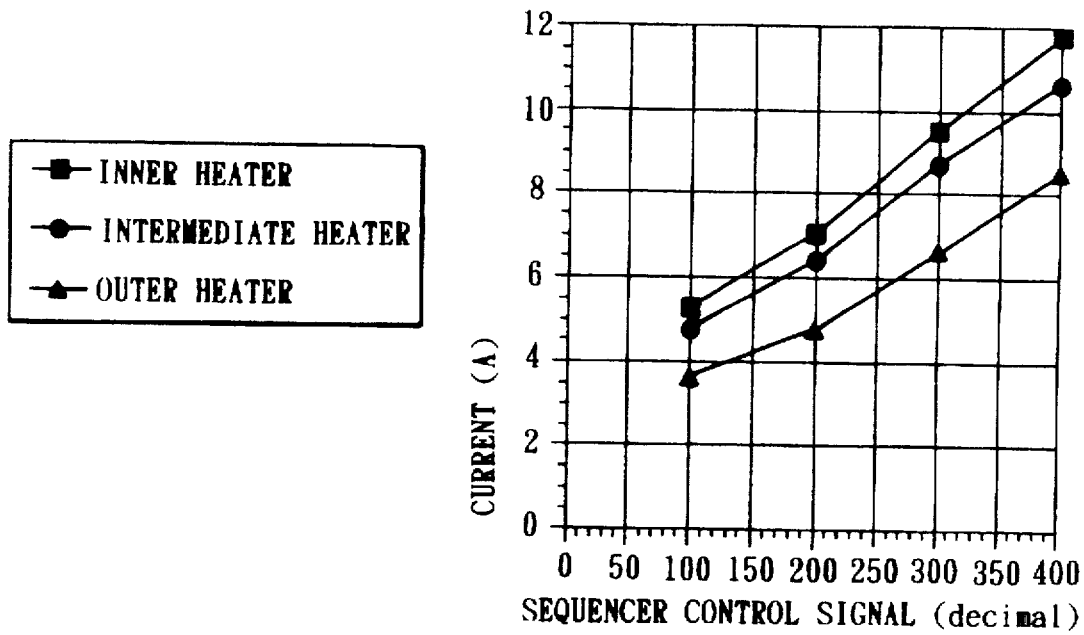
FIG. 4 is a graph showing the relationship between control signal values at various regions on the ceramic heater of this embodiment and current.
Figure 5:
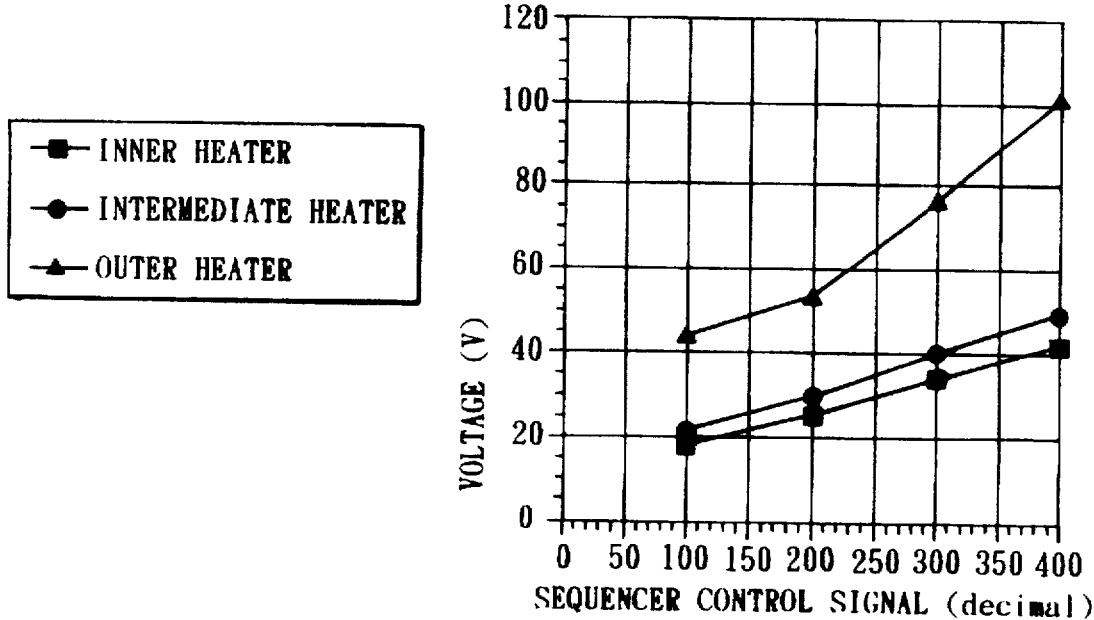
FIG. 5 is a graph showing the relationship between control signal values at various regions on the ceramic heater of this embodiment and voltage.

FIGS. 3–5 are graphs illustrating relationships between sequencer control signals from the above-mentioned control system for each of the inner heater 34a, the intermediate heater 34b and the outer heater 34c of the ceramic heater 31 (axis of abscissa), and power (FIG. 3), current (FIG. 4) and voltage (FIG. 5), respectively. These relationships enable the heat generation of each heater to be appropriately adjusted, thereby controlling temperature distribution on the substrate holder 113 so that temperature distribution on the substrate 114 can be finely adjusted. Power requirements of each heater 34a, 34b and 34c for normal film deposition conditions are 300–500 W for the inner heater 34a, 100–300 W for the intermediate heater 34b, and 500–800 W for the outer heater 34c.

As above, distribution of the radiant heat to the substrate holder 113 can be finely controlled through the pattern formation on the heater element (carbon coating) of the ceramic heater 31 and adjustment of current for each pattern so that the temperature distribution on the substrate holder 113 can be finely controlled.

The life of the ceramic heater 31 is significantly longer than that of the conventional heater using lamps, and is 10–20 times or more longer than the conventional lamp when using it under heat generation condition in usual use (300–1000 W). Thus, the interval for periodic replacement is very long so that the uptime of the CVD apparatus can be improved. With the CVD apparatus including the ceramic heater according to the embodiment, the heater could be continuously used for two years.

Control for heating the substrate holder 113, that is, rising to a predetermined temperature and making the temperature stable, is performed by measuring the temperature of the substrate holder 113 with a thermocouple 125 provided in the substrate holder 113 and by feeding back the measurement to a well known heating control system (not shown).

The ceramic heater 31 according to the embodiment is mounted in a state isolated from the substrate holder 113 with a predetermined distance, and also is isolated from the reflecting plate 38 mounted behind so that it is very easily removed and replaced in a short period of time. Thus, the operating efficiency of the CVD apparatus can be improved.

Film deposition by the above CVD apparatus is performed by placing a substrate 114 on the substrate holder 113 which is maintained at a desired temperature by the ceramic heater 31, and then by introducing the reactive gas through the reactive gas supply plate 112.

Normal film deposition conditions of the CVD apparatus according to the embodiment as the nucleus generation stage, the early stage of film deposition, are a 2–10 sccm flow rate for the reactive gas $WF_6$, a 2–10 sccm flow rate for $SiH_4$, a 100–500 sccm flow rate for the purge gas (Ar), 400°–500° C. for the film deposition temperature, and 0.5–10 Torr for the film deposition pressure. Then, the conditions for a thick film being deposited by reduction of $H_2$ are a 50–200 sccm flow rate for the reactive gas $WF_6$, a 500–2000 sccm flow rate for $H_2$, a 300–1000 sccm flow rate for the purge gas Ar, 400°–500° C. for the film deposition temperature, and 30–7 the film deposition pressure.

According to the embodiment, under such film deposition conditions, a good value of ±5% was obtained for a measured diameter of 140 mm of deposited film distribution, and no film was deposited on the rear surface of the substrate.

What is claimed is:

1. A heater for a CVD apparatus, said CVD apparatus comprising a substrate holder provided in a reactor on which a substrate is placed, a reactive gas supply means for supplying reactive gas to said substrate to deposit a film thereon, a shield mechanism in the reactor provided around said substrate holder to form a purge gas supply passage, said shield mechanism including a ring plate disposed close to the outer periphery of said substrate, whereby purge gas supplied through said purge gas supply passage is blown off from a clearance between said substrate and said ring plate during depositing said film, wherein a heating element for heating said substrate holder so as to indirectly heat said substrate is disposed in said purge gas supply passage close to but not contacting said substrate holder.

2. A heater for a CVD apparatus as claimed in claim 1, wherein said heating element is a ceramic heater, said ceramic heater being fixed on at least three ceramic supports provided on a wall of said reactor.

3. A heater for a CVD apparatus as claimed in claim 2, wherein said ceramic heater is flat, its heat generating surface facing the bottom surface of said substrate holder.

4. A heater for a CVD apparatus as claimed in claim 3, wherein said heat generating surface of said ceramic heater is divided into at least two regions which are separately controlled for temperature.

5. A heater for a CVD apparatus as claimed in claim 4, wherein said regions of said heat generating surface comprise an inner region, an intermediate region, and an outer region.

6. A heater for a CVD apparatus as claimed in claim 2, wherein a protection cover is provided on a wiring terminal of said ceramic heater.

7. A heater for a CVD apparatus as claimed in claim 6, wherein said wiring terminal is made of metal with a high melting point.

8. A heater for a CVD apparatus as claimed in claim 2, wherein a reflecting means is provided behind said ceramic heater.

9. A heater for a CVD apparatus as claimed in claim 1, wherein said heating element is a flat member.

* * * * *